United States Patent [19]
Taylor et al.

[11] Patent Number: 6,162,592
[45] Date of Patent: Dec. 19, 2000

[54] METHODS FOR DECREASING SURFACE ROUGHNESS IN NOVOLAK-BASED RESISTS

[75] Inventors: James Welch Taylor, Cross Plains; Geoffrey William Reynolds, Madison, both of Wis.

[73] Assignee: Wisconsin Alumni Research Foundation, Madison, Wis.

[21] Appl. No.: 09/167,111

[22] Filed: Oct. 6, 1998

[51] Int. Cl.$^7$ ..................................................... G03F 7/32
[52] U.S. Cl. .......................... 430/329; 430/311; 430/327
[58] Field of Search .................................. 430/311, 327, 430/329

[56] References Cited

U.S. PATENT DOCUMENTS

| | | | |
|---|---|---|---|
| 4,294,911 | 10/1981 | Guild | 430/326 |
| 4,423,138 | 12/1983 | Guild | 430/326 |
| 4,784,937 | 11/1988 | Tanaka et al. | 430/331 |
| 4,833,067 | 5/1989 | Tanaka et al. | 430/331 |
| 5,286,600 | 2/1994 | Ochiai et al. | 430/270 |
| 5,292,614 | 3/1994 | Ochiai et al. | 430/270 |
| 5,837,425 | 11/1998 | Nakanishi | 430/302 |

FOREIGN PATENT DOCUMENTS 6-301217  10/1994  Japan .

OTHER PUBLICATIONS

Yoshimura, Toshiyuki et al.; Nano edge toughness in polymer resist patterns, 1993 American Institute of Physics, Appl. Phys. Lett. 63(6), Aug. 9, 1993, pp. 764–766.

Yoshimura, Toshiyuki et al.; Correlation of Nano Edge Roughness in Resist Patterns With Base Polymers, Jpn. J. Appl. Phys., vol. 32 (1993), pp. 6065–6070, Part 1, No. 12B, Dec. 1993.

Reynolds, Geoffrey W. et al.; Surface and Sidewall Roughness Studies of a Chemically–Amplified Resist Exposed to X–Rays, Proceedings of the 11$^{th}$ International Conference on Photopolymers, 1997 (13 pp.).

Reynolds, Geoffrey et al.; Effect of Processing on Surface Roughness for a Negative–Tone, Chemically–Amplified Resist Exposed by X–ray Lithography, Proceedings SPEI 3333, 916 (1998), 8 (8 pp.).

Huang, J–P et al.; *On the Dissolution of Novolak in Aqueous Alkali*, Macromelecules 1989, 22, pp. 4106–4112.

Reiser, A. et al.; *Novolak–Diazoquinine Resists: The Imaging Systems of the Computer Chip*, Agnew Chem. Int. Ed. Engl., 1996, 35, pp. 2428–2440.

Henderson, C.L. et al.; Factors Affecting the Dissolution Rate of Novolac Resins II: Developer Composition Effects, SPIE, vol. 2724, pp. 481–490, 1996.

Arcus, R.A.; Basis for Processing Differences Between Positive Photoresist Developers: Quaternary Alkyl Ammonium Hydroxide and Alkali Metal Hydroxide, Proc. Kodak Microelectronics Seminar, Interface, pp. 25–32, San Diego, Nov. 1985.

*Primary Examiner*—Mark F. Huff
*Assistant Examiner*—Nicole Barreca
*Attorney, Agent, or Firm*—Myers Bigel Sibley & Sajovec

[57] ABSTRACT

Methods of fabricating microelectronic devices comprise applying compositions comprising salt additives and basic components to resists to decrease the surface roughness of the resists and form the microelectronic devices having the resists present therein.

20 Claims, No Drawings

METHODS FOR DECREASING SURFACE ROUGHNESS IN NOVOLAK-BASED RESISTS

STATEMENT OF FEDERAL SUPPORT

The invention was made with Federal Support under Grant Numbers DMR-8821625 and DMR-9531009 from the National Science Foundation and N00014-97-1-0460 from the Office of Naval Research. The government has certain rights to the invention.

FIELD OF THE INVENTION

The invention relates to processes involving microelectronic devices, and more specifically processing involving resists used in microelectronic devices.

BACKGROUND OF THE INVENTION

Conventional microelectronic devices are employed in a vast number of consumer and industrial electronic products. Patterns that interconnect components used in these devices are typically formed by lithography processes. A conventional lithography process involves applying a resist to a silicon-containing wafer. A clear and opaque mask containing features that define the pattern to be created in the resist is then placed over the wafer, and the resist is subsequently exposed to light. The resist is then developed using a solution, and specified resist regions are etched to form a pattern in the wafer.

It may be desirable to manufacture microelectronic devices having smaller critical dimensions. In particular, wafers employed in these devices often have narrower line widths. As a result, more components (e.g., transistors) may be placed on the wafers, thus making microelectronic devices formed from these wafers potentially faster in operation and less expensive.

Manufacturing microelectronic devices having smaller critical dimensions, however, may present certain difficulties. For example, the performance of devices with resists having narrower and narrower line widths may become more adversely affected by resist surface roughness. Thus, it is expected that the roughness of a resist will make a substantially larger contribution to the error budget for the resist critical dimension. For example, if the error budget for a 100 nanometer (nm) line is plus or minus 7 percent, that is 7 nm, any roughness on the resist on the order of 7 nm would consume the entire error budget, thus potentially leaving little or no latitude for variations in processing. Moreover, resist surface roughness may be exacerbated due to the use of conventional resist developing solutions.

It is believed that the degree of resist roughness may be dependent upon the type of polymer used in the resist. For example, Yoshimura et al., *Appl. Phys. Lett.* 63 (6) 764–766 (1993) proposes that differences in polymer species utilized in the base resins which form the resists can result in differences in resist surface roughness.

In view of the above, it would be desirable to be able to reduce surface roughness by processing means. As a result, one could potentially control surface roughness independently of the type of polymer employed in the resist base resin. Moreover, it would be desirable to alleviate the potential adverse effects of developing solutions on resist surface roughness.

SUMMARY OF THE INVENTION

In view of the above, it is an object of the present invention to provide methods for fabricating microelectronic devices in which the surface roughness of resists used in these devices may be reduced.

It is an object of the invention to provide methods for fabricating microelectronic devices that may reduce the surface roughness of resists relative to using conventional developing solutions.

These objects and others are achieved by the present invention. The invention relates to methods for fabricating microelectronic devices. The methods comprise applying compositions to resists to decrease the surface roughness of the resists and form the microelectronic devices having the resists present therein.

The compositions comprise salt additives and basic components. Unexpectedly, the use of these components is believed to result in a decrease in resist surface roughness relative to employing conventional developing solutions. The compositions are preferably present in the form of aqueous solutions. Preferred salt additives include quaternary salts, and preferred basic components include organic hydroxides.

The invention is believed to be advantageous in that the application of the compositions may decrease surface roughness in exposed or unexposed resists, while not inhibiting dissolution processes on the resists during their development.

DETAILED DESCRIPTION OF THE PREFERRED EMBODIMENTS

The present invention now will be described more fully hereinafter with reference to the accompanying specification and examples, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The invention generally relates to methods of fabricating microelectronic devices. The methods comprise applying compositions, typically in the form of aqueous solutions, comprising salt additives and basic components to decrease the surface roughness of resists and form the microelectronic devices having the resists present therein. For the purposes of the invention, "surface roughness" is defined as conventionally known in the art. Namely, images (e.g., one micron Atomic Force Microscope (AFM)) are taken of a resist treated by the method of the invention and the surface roughness of the resist is then determined. The term "decrease in surface roughness" refers to the decrease in resist surface roughness subsequent to applying the composition of the invention relative to the application of a conventional developing composition.

The resists which are treated by the methods of the invention are typically utilized in the form of resist compositions. The resist compositions used in the methods of the invention may encompass various resists known to those skilled in the art, such as positive and negative resists. Resins formed from various polymers may be used in the resists. For example, novolak-based resins may be employed such as, but not limited to, those taught in U.S. Pat. No. 4,294,911, the disclosure of which is incorporated herein by reference in its entirety. The novolak-based resins may be prepared using conventional techniques. For example, the novolak-based resins may be prepared by the condensation of phenols and aldehydes under acidic conditions. In a typical synthesis, the novolak-based resins are prepared by heating one mole of phenol with 0.5 mole of formaldehyde under acidic conditions. The temperatures under which the reaction is conducted may range from about 25° C. to about 175° C.

More particularly, the novolak-based resins may be prepared by the condensation of phenol with formaldehyde, more generally by the reaction of a phenolic compound having two or three reactive aromatic ring hydrogen positions with an aldehyde or aldehyde-liberating compound capable of undergoing phenol-aldehyde condensation. Illustrative of particularly useful phenolic compounds are cresol, xylenol, ethylphenol, butylphenol, isopropylmethoxyphenol, chlorophenol, resorcinol, hydroquinone, naphthol, 2,2-bis(p-hydroxyphenyl) propane, and the like. Examples of aldehydes which may be employed include, but are not limited to, formaldehyde, acetaldehyde, acrolein, crotonaldehyde, furfural, and the like. An example of an aldehyde-liberating compound which may be used includes, but is not limited to, 1,3,5-trioxane. Ketones such as acetone are also capable of condensing with the phenolic compounds. Preferred phenolic resins include cresol-formaldehyde and phenol-formaldehyde.

The resist compositions may also comprise light-sensitive components such as, for example, a quinone diazide moiety which can either be condensed with the resin, or admixed with the resin in the form of a monomer, or is present both as part of the resin and as the monomer admixed therewith. Examples of these components and techniques for using them in conjunction with the resists can be found in U.S. Pat. Nos. 4,294,911 and 4,423,138, the disclosures of which are incorporated herein by reference in their entirety.

The resist compositions may also include non light-sensitive compounds (e.g., polymeric binders such as alkyl methacrylates); and sensitivity-enhancing agents (e.g., polyhalogenated heterocyclic compounds) in amounts known to one skilled in the art. Dyes, pigments, surfactants, stabilizers, photoactive compounds, and the like, all of which are conventional and known in the art, may also be employed.

The compositions of the invention which are applied to the resist are typically in the form of aqueous solutions. More specifically, the compositions are usually in the form of developing solutions comprising salt additives. Examples of developing compositions are set forth in U.S. Pat. Nos. 4,294,911 and 4,423,138. These compositions comprise basic components. The term "basic components" refer to components which, upon addition to an aqueous solution, allow for a solution with a pH equal to or greater than about 12.5, and more preferably equal to or greater than about 13.3. Various basic solutes effective to provide such a pH may be employed as the basic component. Preferred solutes are those such as, but not limited to, organic hydroxides like tetramethylammonium hydroxide, tetraethylammonium hydroxide, methyltriethanolammonium hydroxide, sodium silicate, and sodium silicate admixed with sodium phosphate. Additional solutes include inorganic hydroxides such as, for example, sodium hydroxide, ammonium hydroxide, phosphonium hydroxide, potassium hydroxide, and the like. Mixtures of the above may be employed. Preferably, the basic components are present in the compositions at concentrations ranging from about 0.2 M to about 0.35 M.

The compositions of the invention that are applied to the resist compositions comprise salt additives. The salt additives may be selected from various components, typically an inorganic salt or a quaternary salt. The salt additives may also encompass other components such as, for example, phosphorus-containing components such as phosphonium salts.

Examples of inorganic salts include, but are not limited to, alkaline halide salts such as, for example, lithium chloride, sodium chloride, potassium chloride, and the like . Examples of quaternary salts include quaternary halide salts, and more preferably quaternary ammonium halide salts such as those represented by the formula:

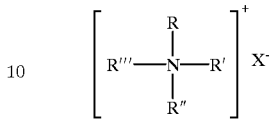

wherein X is a halide (e.g., chlorine, bromine, or fluorine), and R, R', R", and R'" may be the same or different and selected from the group consisting of $C_1$ to $C_8$ alkyl. The alkyl groups used in the above formula may be saturated or unsaturated and also may contain various functional groups such as, but not limited to, hydroxy. Exemplary quaternary ammonium halide salts include, but are not limited to, choline chloride, tetraethylammonium chloride, and the like. Mixtures of the above may be employed if so desired.

The compositions of the invention may comprise other components and additives which are typically employed in resist developing compositions. Examples of these components and additives include, but are not limited to, surfactants, stabilizers, developing agents, and the like. Moreover, cations or anions may be added to the resists. Examples of cations include, but are not limited to, tetraethylammonium, tetrapropylammonium, tetrabutylammonium, tetrapentylammonium, benzyltriethylammonium, benzyltriphenylphosphonium, tetrabutylphosphonium, and mixtures thereof. The selection of these components and additives are known to one skilled in the art.

The salt additives may be present in various concentration levels in the compositions. Preferably, the concentrations of the salt additives range from about $10^{-4}$ M to about 2 M, more preferably from about 0.3 M to about 2 M, and most preferably from about 1 M to about 1.5 M. In another embodiment, different concentration levels may be employed for different types of salt additives that are used. For example, the concentration of choline chloride preferably ranges from about 0.5 M to about 2 M, and is most preferably from about 1 M to about 1.4 M. The concentration of tetraethylammonium chloride preferably ranges from about 0.02 M to about 1 M, and is most preferably from about 0.3 M to about 1 M. The methods of the invention are able to typically reduce the surface roughness of a resist from about 5 to about 80 percent, more preferably from about 20 to about 80 percent, and most preferably from about 50 to about 80 percent. The percent reductions in surface roughness are determined relative to using compositions containing basic components without the salt additives.

In accordance with conventional techniques, the resist is first applied, preferably spin casted, onto a substrate such as, for example, a silicon wafer. The resist may then be exposed through a mask, although this step is not necessary for carrying out the methods of the invention. The compositions of the invention are then applied to the silicon wafers having the resist compositions coated thereon. The compositions are typically applied under processing conditions typically employed in conjunction with conventional developing compositions. Thereafter, the surface roughness of the resists may be determined using known techniques. The manner of preparing the resist and coating in onto a substrate or support, and then applying the composition of the invention thereto, is carried out by using procedures which are known to one who is skilled in the art.

The invention will now be described in greater detail with reference to the examples which follow. It should be understood that the examples are set forth only to illustrate the invention, and are not meant as a limitation thereof.

EXAMPLE 1

Various levels of choline chloride were added to developing compositions comprising 0.305 N of tetramethylammonium hydroxide such that the concentration levels of choline chloride were 0.42 M, and 1.44 M in the developing compositions. The developing compositions were employed on films of SAL 605 sold by the Shipley Company of Marlboro, Mass. and the films were then developed. The development of the films was arrested by rinsing the films in deionized water and drying them with nitrogen. One micron AFM images were taken and analyzed for roughness.

The RMS roughness was determined to be as follows:

| RMS Roughness (nm) | Salt Concentration (M) |
|---|---|
| 5.59 | 0.42 |
| 1.90 | 1.44 |

EXAMPLE 2

A procedure similar to that set forth in Example 1 was employed except that tetraethylammonium chloride was used in place of choline chloride. The RMS roughness was determined to be as follows:

| RMS Roughness (nm) | Salt Concentration (M) |
|---|---|
| 4.64 | 0.0033 |
| 3.27 | 0.27 |

In the examples and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of fabricating a microelectronic device, said method comprising:

forming a resist on a microelectronic substrate; and
   developing the resist by applying a composition comprising a salt additive and a basic component to the resist such that the surface roughness of the resist is less than the surface roughness that would result from developing the resist using compositions containing basic components but without salt additives, wherein the salt additive consists of an inorganic salt, wherein the concentration of the salt additive in the composition ranges from about $10^{-4}$ M to about 2 M, and wherein the basic component consists of an organic hydroxide.

2. A method according to claim 1, wherein the inorganic salt is an alkaline halide salt selected from the group consisting of lithium chloride, sodium chloride, potassium chloride, and mixtures thereof.

3. A method according to claim 1, wherein the organic hydroxide is tetramethylammonium hydroxide.

4. A method according to claim 1, wherein the surface roughness of the resist is about 20 to about 80 percent less than the surface roughness that would result from developing the resist using compositions containing basic components but without salt additives.

5. A method according to claim 1, wherein the composition further comprises a surfactant.

6. A method according to claim 1, wherein the resist is a novolak- based resist.

7. A method for fabricating a microelectronic device said method comprising:

forming a resist on a microelectronic substrate; and
   developing the resist by applying a composition comprising a quaternary salt component and a basic component to the resist such that the surface roughness of the resist is less than the surface roughness that would result from developing the resist using compositions containing basic components but without quaternary salt components, wherein the concentration of the quaternary salt component in the composition ranges from about 1 M to about 2 M.

8. A method according to claim 7, wherein the quaternary salt component is selected from the group consisting of choline chloride, tetraethylammonium chloride, and mixtures thereof.

9. A method according to claim 7, wherein the basic component is organic hydroxide.

10. A method according to claim 9, wherein the organic hydroxide is tetramethylammonium hydroxide.

11. A method according to claim 7, wherein the surface roughness of the resist is about 20 to about 80 percent less than the surface roughness that would result from developing the resist using compositions containing basic components but without quaternary salt components.

12. A method according to claim 7, wherein the composition further comprises a surfactant.

13. A method according to claim 7, wherein the resist is a novolak-based resist.

14. A method of fabricating a microelectronic device, said method comprising:

forming a resist on a microelectronic substrate; and
   developing the resist by applying a composition consisting essentially of a salt additive and a basic component to the resist such that the surface roughness of the resist is less than the surface roughness that would result from developing the resist using compositions containing basic components but without salt additives, wherein the salt additive consists of an inorganic salt, and wherein the basic component consists of an organic hydroxide.

15. A method according to claim 14, wherein the inorganic salt is an alkaline halide salt selected from the group consisting of lithium chloride, sodium chloride, potassium chloride, and mixtures thereof.

16. A method according to claim 14, wherein the organic hydroxide is selected from the group consisting of tetramethylammonium hydroxide, tetraethylammonium hydroxide, methyltriethanolammonium hydroxide, and mixtures thereof.

17. A method according to claim 14, wherein the organic hydroxide is tetramethylammonium hydroxide.

18. A method according to claim 14, wherein the concentration of the salt additive in the composition ranges from about $10^{-4}$ M to about 2 M.

19. A method according to claim 14, wherein the surface roughness of the resist is about 20 to about 80 percent less than the surface roughness that would result from developing the resist using compositions containing basic components but without salt additives.

20. A method according to claim 14, wherein the resist is a novolak-based resist.

* * * * *